United States Patent [19]
Brady et al.

[11] Patent Number: 5,416,807
[45] Date of Patent: May 16, 1995

[54] METHOD AND APPARATUS FOR SYNCHRONIZING PERIODIC SYNC PULSE GENERATIONS BY A NUMBER OF HIGH SPEED CIRCUITS

[75] Inventors: Gary Brady, Portland; David Ellis, Hillsboro, both of Oreg.

[73] Assignee: Intel Corporation, Santa Clara, Calif.

[21] Appl. No.: 40,901

[22] Filed: Mar. 31, 1993

[51] Int. Cl.⁶ ............................................. H04L 7/00
[52] U.S. Cl. .................................... 375/356; 375/371; 327/91; 327/141
[58] Field of Search ............ 375/106, 107, 109, 118, 375/119, 120; 371/1; 328/55, 63, 151; 307/590, 595, 352

[56] References Cited
U.S. PATENT DOCUMENTS 4,823,283  4/1989  Diehm et al. ............................ 364/518

*Primary Examiner*—Stephen Chin
*Assistant Examiner*—Tesfaldet Bocure
*Attorney, Agent, or Firm*—Blakely, Sokoloff, Taylor & Zafman

[57] ABSTRACT

Each of the remote high speed circuits of a digital system is provided with a sync pulse generation circuit for generating periodic sync pulses with a predetermined periodicity using a control value. Additionally, each of the remote high speed circuits is further provided with a sampling circuit for sampling the sync pulse generation control value, a comparison circuit for determining whether each of the sampled sync pulse generation control values are consistent, and an adjustment circuit for adjusting the sync pulse generation control value of the particular remote high speed circuit. Furthermore, a sync pulse generation coordinator comprising a clock selection circuit, a delay line, a delayed clock selection circuit, and a coordination pulse generation circuit is provided to the digital system for generating periodic coordination pulses. The periodic coordination pulses are used to control the sampling and comparison. A different delayed reference clock is used to generate the coordination pulses to control the sampling and comparison until a delayed reference clock that leads to consistent samples of control values for all remote high speed circuits is found. Once consistent sampling results are achieved, the sync pulse generation control values of the remote high speed circuits are adjusted accordingly using the adjustment circuits. The process is repeated until all sampled results are consistent and synchronized. The sampling is then continued to monitor for loss of synchronization.

39 Claims, 10 Drawing Sheets

METHOD AND APPARATUS FOR SYNCHRONIZING PERIODIC SYNC PULSE GENERATIONS BY A NUMBER OF HIGH SPEED CIRCUITS

BACKGROUND OF THE INVENTION

1. Field of the Invention

The present invention relates to the field of high speed digital circuits, in particular, high speed digital circuits based on CMOS technology. More specifically, the present invention relates to a method and apparatus for synchronizing periodic sync pulse generations by multiple remote high speed digital circuits in a digital system, such as a data instrumentation system.

2. Background

In a number of digital applications, such as data instrumentation, it is often necessary for multiple interrelated high speed circuits to generate synchronization signals to enable another circuit to synchronize certain processing. These circuits include but not limited to those operating at a speed of 66 MHZ or higher. A particular example is when a stream of data is being decomposed and sent in the form of multiple interrelated streams of data slices from a number of remote high speed circuits to a high speed acquisition circuit. More specifically, when each stream of data slices is sent with its own clock to allow the high speed acquisition circuit to capture the data from the interrelated streams of data slices. Since the different streams may encounter different analog delays in the system as they travel from the remote high speed circuits to the high speed acquisition circuit, the high speed acquisition circuit must be able to properly capture the data from corresponding data slices in the interrelated streams. One approach is for each of the remote high speed circuits to send an additional series of periodic sync pulses having the same predetermined periodicity, each generated at the same input clock edge, thereby allowing the high speed acquisition circuit to discern the correspondence of the data slices in the different streams. For further description of using periodic sync pulses to synchronize data slices with variable skews, see copending U.S. patent application Ser. No. 08/040,902, entitled Method and Apparatus For Resynchronizing Data Slices With Variable Skews, assigned to assignee of the present invention, which is hereby fully incorporated by reference.

However, it remains necessary for the the various series of periodic sync pulses to be generated in a synchronized manner. Thus, it is desirable to be able to synchronize the periodic sync pulse generations by multiple remote high speed circuits. As will be disclosed, the present invention provides such a method and apparatus, which advantageously achieves the desirable results. As will be obvious from the descriptions to follow, the present invention has particular application to high speed data instrumentation systems.

SUMMARY OF THE INVENTION

Under the present invention, the desirable results are advantageously achieved by providing each of the remote high speed circuits with a sync pulse generation circuit, an adjustment circuit, a sampling circuit, and a comparison circuit. The sync pulse generation circuit comprises a gray code counter for generating the periodic sync pulses with a predetermined periodicity based on a control value. The adjustment circuit comprises control logic for adjusting the gray code counter of its companion sync pulse generation circuit relative to the gray code counters of the other sync pulse generation circuits. The sampling circuit comprises a number of registers for taking and storing a number of samples of the control value in the gray code counter of its companion sync pulse generation circuit. The comparison circuit comprises comparison logic for determining whether the sample results taken and stored in its companion sampling circuit are consistent.

Additionally, a sync pulse generation coordinator comprising a clock selection circuit, a delay line, a delayed clock selection circuit, and a coordination pulse generation circuit is provided to the digital system. The clock selection circuit comprises selection logic for selecting a reference clock for the delay line. The delay line comprises a number of delay elements for outputting various delayed reference clocks having different delays applied to them at various delay points in the delay line. The delayed clock selection circuit comprises selection logic for selecting one of the delayed reference clocks for the coordination pulse generation circuit. The coordination pulse generation circuit comprises a gray code counter for generating periodic coordination pulses using the delayed reference clock provided.

The coordination pulses generated are provided to the sampling circuits of the remote high speed circuits. In response to the coordination pulses, the sampling circuit in each of the remote high speed circuits takes and stores multiple samples of the control value of the gray code counter of its companion sync pulse generation circuit. The comparison circuit in each of the remote high speed circuits then determines whether the sample results taken and stored by its companion sampling circuit are consistent. Different delayed reference clocks are provided to the coordination pulse generation circuit in the sync pulse generation coordinator until a delayed reference clock causing periodic coordination pulses to be generated with the appropriate timing is found, i.e. timing that leads to consistent sample results being taken and stored by all sampling circuits. Once consistent sample results are achieved in all sampling circuits, the grey code counter in each of the sync pulse generation circuits of the remote high speed circuits are adjusted accordingly. The process is repeated until all sync pulse generation control values are synchronized, thereby synchronizing the periodic sync pulse generations.

BRIEF DESCRIPTION OF THE DRAWINGS

The objects, features, and advantages of the present invention will be apparent from the following detailed description of the presently preferred and alternate embodiments of the invention with references to the drawings in which.

DETAILED DESCRIPTION PRESENTLY PREFERRED AND ALTERNATE EMBODIMENTS

In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
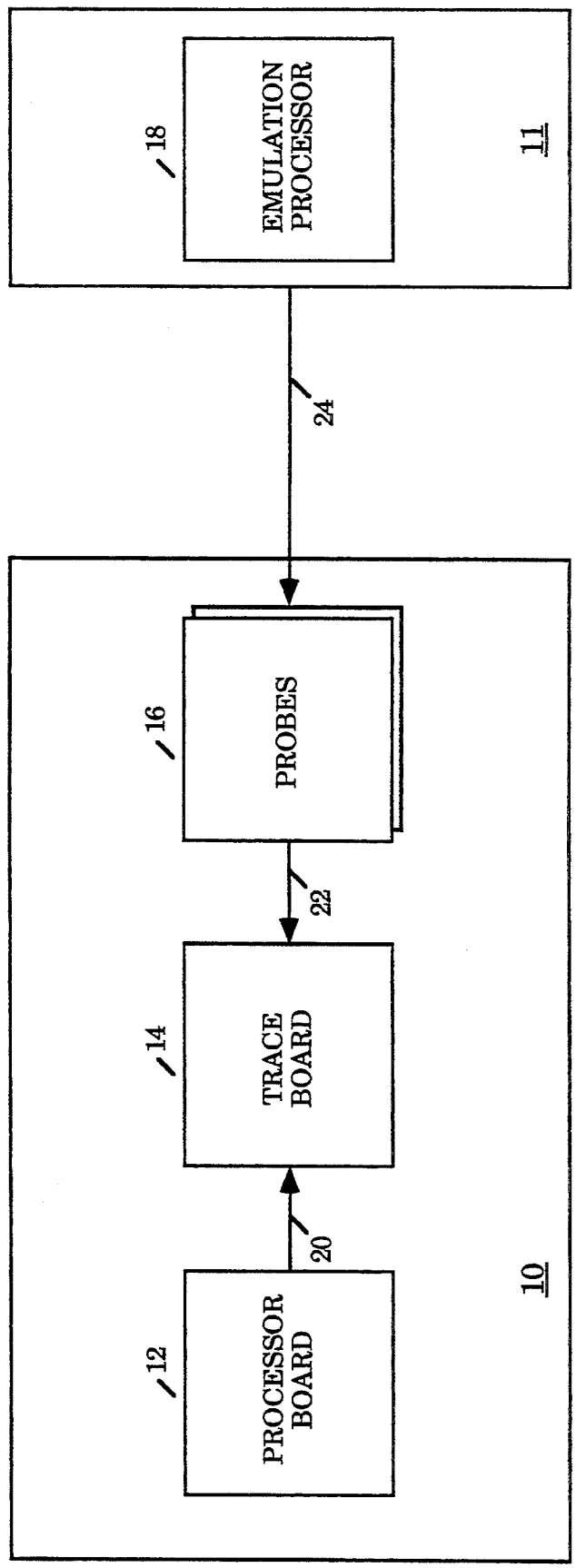
FIG. 1 illustrates an exemplary high speed data instrumentation system incorporated with the teachings of the present invention.

Referring now to FIG. 1, a block diagram illustrating an exemplary high speed data instrumentation system incorporated with the teachings of the present invention is shown. Shown is an exemplary data instrumentation system 10 incorporated with the teachings of the present invention coupled to a target system 11 for monitoring, acquiring data, and controlling the target system 11. The exemplary data instrumentation system 10 comprises a processor board 12, a trace board 14, and a number of probes 16, while the target system 11 comprises an emulation processor. The processor board 12 is coupled to the trace board 14, for example, through a parallel bus 20. The trace board 14 is coupled to the probes 16, for example, through a number of parallel cables 22. The probes 16 are in turn coupled to the emulation processor 18. Data are decomposed and sent as multiple streams of data slices from the probes 16 to the trace board 14. Each stream of data slices is sent with its own clock and a series of periodic sync pulses to enable the data to be properly recombined in the trace board 14, as described in the copending application Ser. No. 08/040,902 identified above. Additionally, the trace board 14 and the probes 16 are incorporated with the teachings of the present invention for synchronizing periodic sync pulse generations by the probes 16. The trace board 14 and the probes 16 will be described below in further detail with additional references to the remaining figures. The processor board 12 and the emulation processor 18 are intended to represent a broad category of these elements found in many data instrumentation systems. Their constitutions and functions are well known and will not be further described.

While the present invention is being described with a trace board and a number of probes, based on the description to follow, it will be appreciated that the present invention may be practiced with any interrelated data sending remote high speed digital circuits on a high speed data instrumentation system. In fact, the present invention may be practiced with any digital systems comprising such interrelated data sending remote high speed digital circuits, including but not limited to microprocessor based computer systems.

Figure 2:
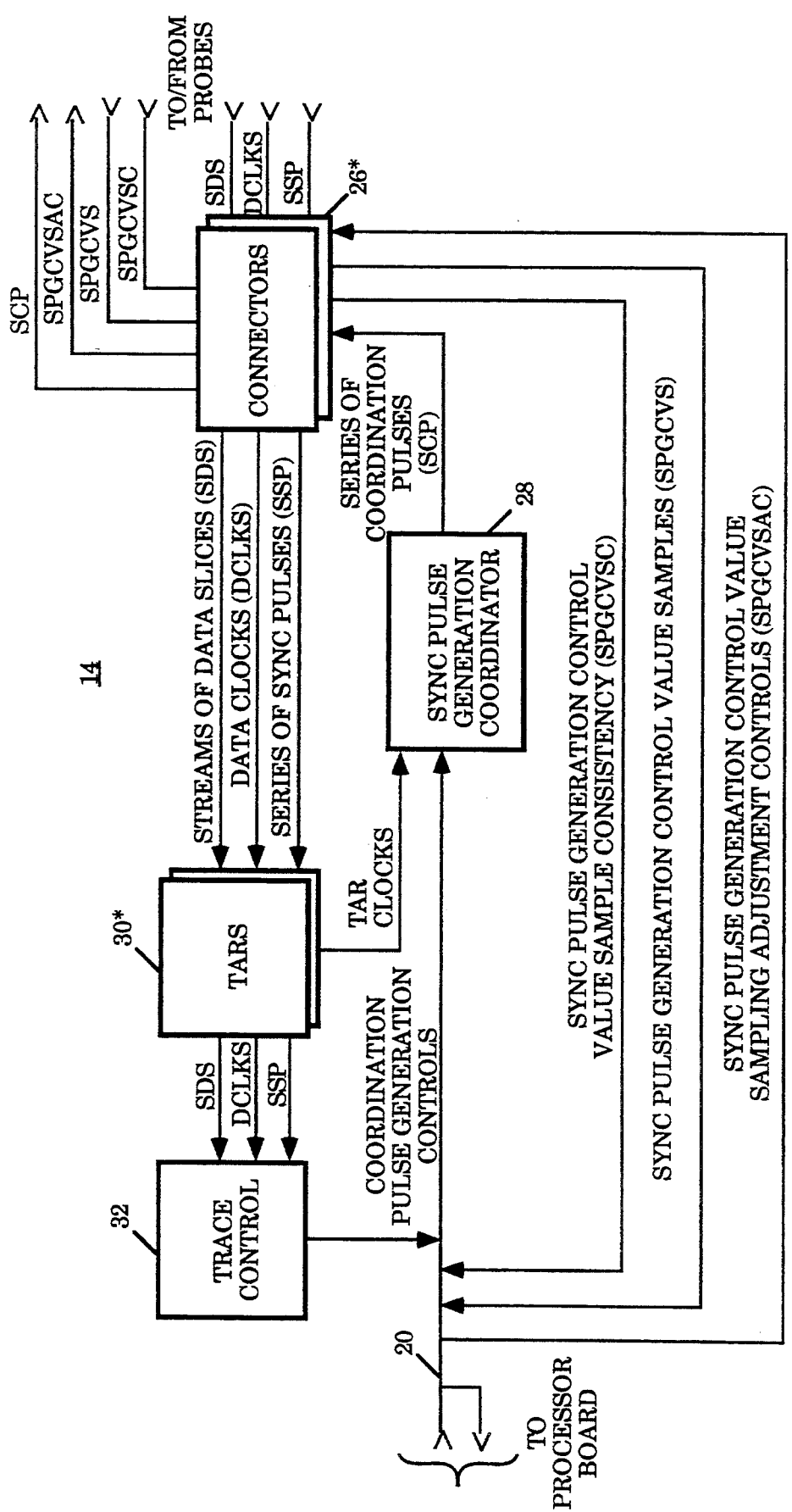
FIG. 2 illustrates the trace board of FIG. 1 in further detail.

Referring now to FIG. 2, a block diagram illustrating the trace board of FIG. 1 in further detail is shown. The trace board 14 comprises a plurality of high speed trace and recognition circuitry (TAR) 30*, a plurality of probe connectors 26*, and trace control circuitry 32. The high speed TARs 30* are coupled to the probe connectors 26* and the trace control circuitry 32. The probe connectors 26* and the trace control circuitry 32 are also coupled to the processor board through the parallel bus 20. The probes are connected to the trace board 14 through the probe connectors 26*. Each of the high speed TARs 30* receives a stream of data slices (SDS) along with its own digital clock (DCLKS) from a probe through its corresponding probe connector 26*. The various streams of data slices are in turn provided to the trace control circuitry 32 for recombination, incurring varying amount of delays as they travel through the TARs 30*. Each stream of data slices is also sent from the probes with a series of periodic sync pulses (SSP) to enable the trace control circuitry 32 to determine the correspondence of the data slices in the various streams. The TARs 30*, the probe connectors 26*, and the trace control circuitry 32, except for the manners they cooperate with the elements of the present invention, and the teachings of the related application incorporated, they are intended to represent a broad category of these elements found in many trace boards. Their constitutions and functions are well known, and will not be otherwise described further.

As illustrated in FIG. 2, the trace board 14 further comprises the sync pulse generation coordinator 28 of the present invention. The sync pulse generation coordinator 28 is coupled to the TARs 30*, the probe connectors 26*, and the processor board. The sync pulse generation coordinator 28 is used, in conjunction with other elements of the present invention provided to each of the probes, to synchronize periodic sync pulse generations by the probes. The sync pulse generation coordinator 28, and the manner it cooperates with other elements of the present invention to synchronize periodic sync pulse generations by the probes, will be described in further detail below.

Figure 3:
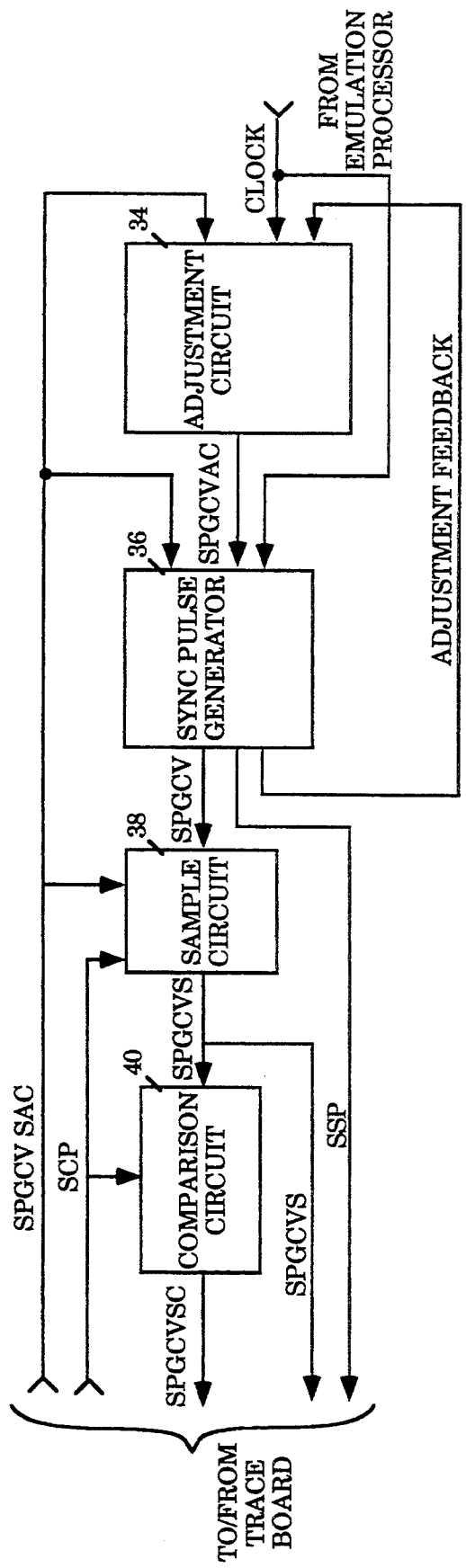
FIG. 3 illustrates one embodiment of the sync pulse generation and related circuitry of the present invention provided to each probe of FIG. 1 in further detail.

Referring now to FIG. 3, a block diagram illustrating the sync pulse generation and related circuitry of the present invention provided to each of the probes in FIG. 1 is shown. The sync pulse generation and related circuitry of the present invention provided to each probe 16* comprises a sync pulse generation circuit 36 coupled to a probe connector on the trace board and the emulation processor. The sync pulse generation circuit 36 of each probe 16* is used to generate the periodic sync pulses (SSP) corresponding to the stream of data slices being sent to the trace board by the particular probe 16*. The sync pulse generation circuit 36 of each probe 16*, and the generation of sync pulses by each probe 16*, will be described in further detail below.

As illustrated in FIG. 3, the sync pulse generation and related circuitry of the present invention provided to each probe 16* further comprises an adjustment circuit 34, a sampling circuit 38, and a comparison circuit 40, all coupled to the same probe connector on the trace board as the sync pulse generation circuit 36. The adjustment circuit 34 of each probe 16* is also coupled to the sync pulse generation circuit 36 of the particular probe 16* and the emulation processor (clock only), while the sampling circuit 38 of each probe 16* is also coupled to the sync pulse generation circuit 36 and the comparison circuit 40 of the particular probe 16*. The adjustment circuits 34, the sampling circuits 38, and the comparison circuits 40 of the various probes 16 are used, in conjunction with the sync pulse generation coordinator of the trace board, to synchronize the sync pulse generations by the sync pulse generation circuits 36 of the various probes 16. The adjustment circuits 34, the sampling circuits 38, and the comparison circuits 40 of the various probes 16, and the manner they cooperate with the sync pulse generation coordinator of the trace board to synchronize periodic sync pulse generations by the sync pulse generation circuit 36 of the various probes, will all be described in further detail below.

While the present invention is being described with an embodiment having a sampling, a comparison, and an adjustment circuit provided to each of the probes, based on the description to follow, it will be appreciated that the present invention may be practiced with consolidated sampling, comparison and adjustment circuits coupled to the sync pulse generation circuits of the probes.

Figure 7:
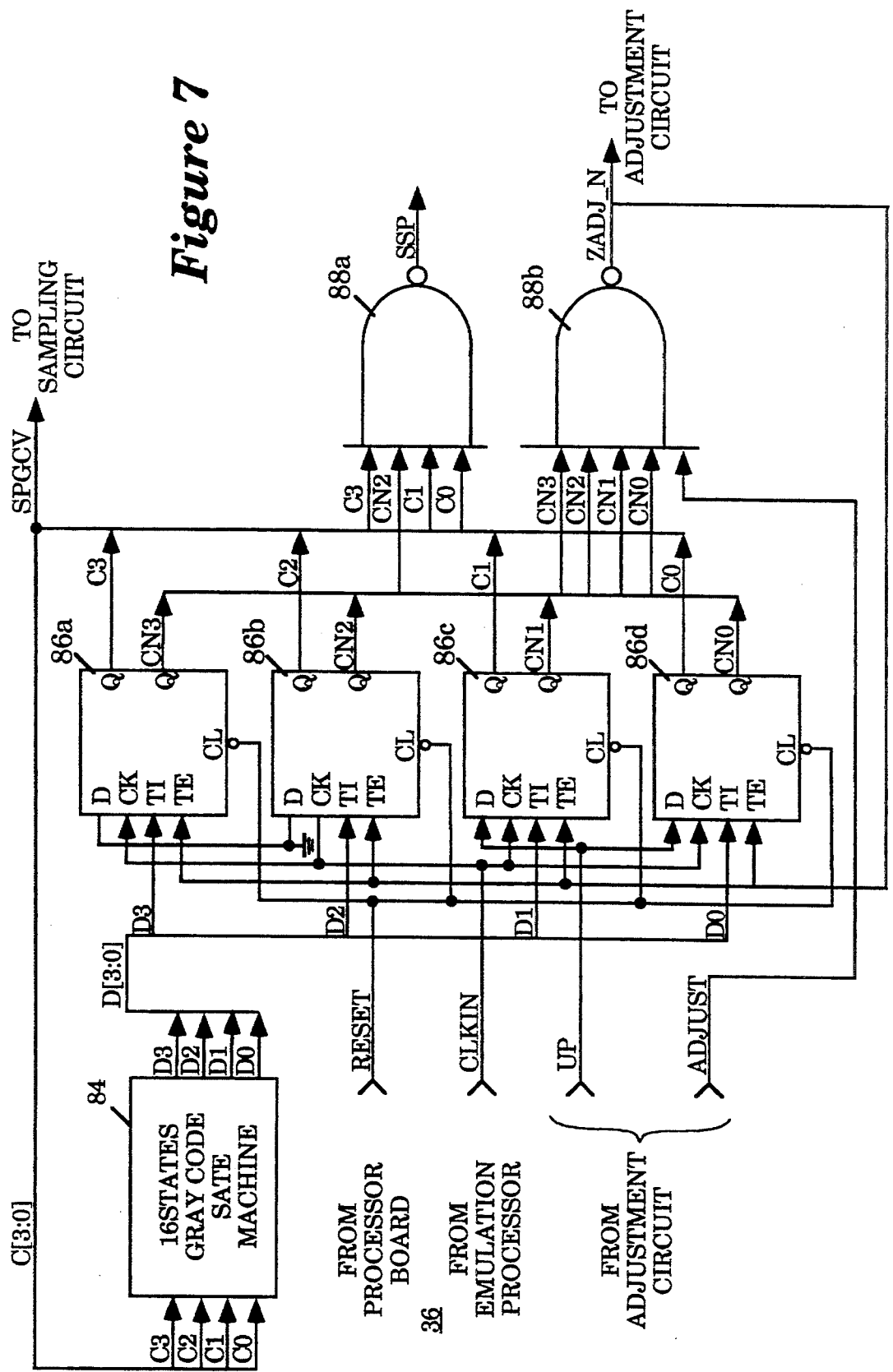
FIG. 7 illustrates one embodiment of the sync pulse generation circuit of FIG. 3 in further detail.

Referring now to FIG. 7, a block diagram illustrating one embodiment of the sync pulse generation circuit provided to each probe in further detail is shown. In this embodiment, the sync pulse generation circuit 36 comprises a 16 states gray code state machine 84, four flip-flops 86a–86d with selectable dual inputs, and two multiple input NAND gates 88a–88b serially coupled to each other. The 16 states gray code state machine 84 is used to generate 16 gray code state values, one at a time, in a round robin manner. In other words, the state machine 84 outputs {0000}, {0001}, {0011}, . . . {1011}, {1001 }, and {1000} in a round robin manner. Each gray code state value output by the state machine 84 is clocked into the four flip-flops 86a–86d through the TI inputs (TI is selected during normal operation), using a buffered input clock (CLKIN) provided to the particular probe by the emulation processor. Concurrently, each gray code state value and its complement are clocked out of the Q and Q' outputs of the flip-flops 86a–86b. Selected bits of each clocked out gray code state value and its complement are then provided to the first NAND gate 88a to generate a sync pulse. Each clocked out gray code state value is also provided back to the state machine 84 to cause it to generate the next gray code state value. As the process repeats itself, a sync pulse is generated once every 16 clock periods for the particular probe.

Thus, the generation of sync pulses by the sync pulse generation circuit 36 of each probe can be synchronized by adjusting the control value in the flip-flops 86a–86d of the sync pulse generation circuit 36 of each probe. The adjustments are effectuated in each probe through the D inputs of the flip-flops 86a–86d of the sync pulse generation circuit 38 of the particular probe, using the second NAND gate 88b of the particular sync pulse generation circuit 36 to generate the TE inputs for the particular flip-flops 86a–86d. The manner in which adjustments to the flip-flops 86a–86d of the sync pulse generation circuit 36 of each probe 16* are effectuated will be discussed in further detail below.

While the present invention is being described with sync pulse generation circuits having 16 states gray code state machines for generating sync pulse series having the same periodicity of one sync pulse every 16 clock periods, it will be appreciated that the present invention may be practiced with sync pulse generation circuits that generate sync pulse series with other periodicities.

Referring back to FIGS. 2–3, as described earlier, the sync pulse generation coordinator 28 of the trace board 14, and the adjustment circuits 34, the sampling circuits 38, and the comparison circuits 40 of the various probes 16 cooperate to synchronize periodic sync pulse generations by the sync pulse generation circuits 36 of the various probes 16. The sync pulse generation coordinator 28 of the trace board 14 is used to generate coordination pulses (SCP) for the sampling circuits 38 and the comparison circuits 40 of the various probes 16. The sampling circuit 38 of each probe 16* is used to capture a number of samples of the sync pulse generation control values (SPGCV) of the sync pulse generation circuit 36 of the probe 16*. The comparison circuit 40 of each probe 16* is used to compare and determine whether the sync pulse generation control value samples (SPGCVS) taken for the probe 16* are consistent or not. The adjustment circuit 34 of each probe 16* is used to generate sync pulse generation control value adjustment controls (SPGCVAC) for the sync pulse generation circuit 36 of the probe 16*.

Figure 4:
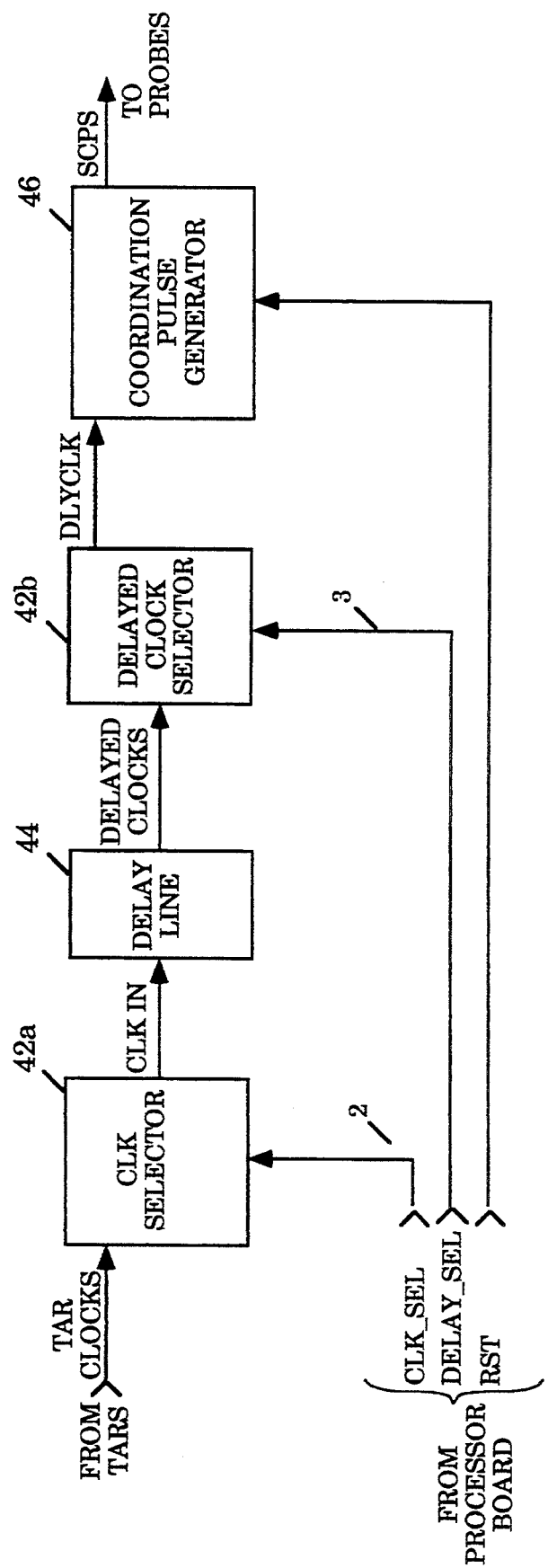
FIG. 4 illustrates one embodiment of the sync pulse generation coordinator of the present invention provided to the trace board of FIG. 2 in further detail.
Figure 5:
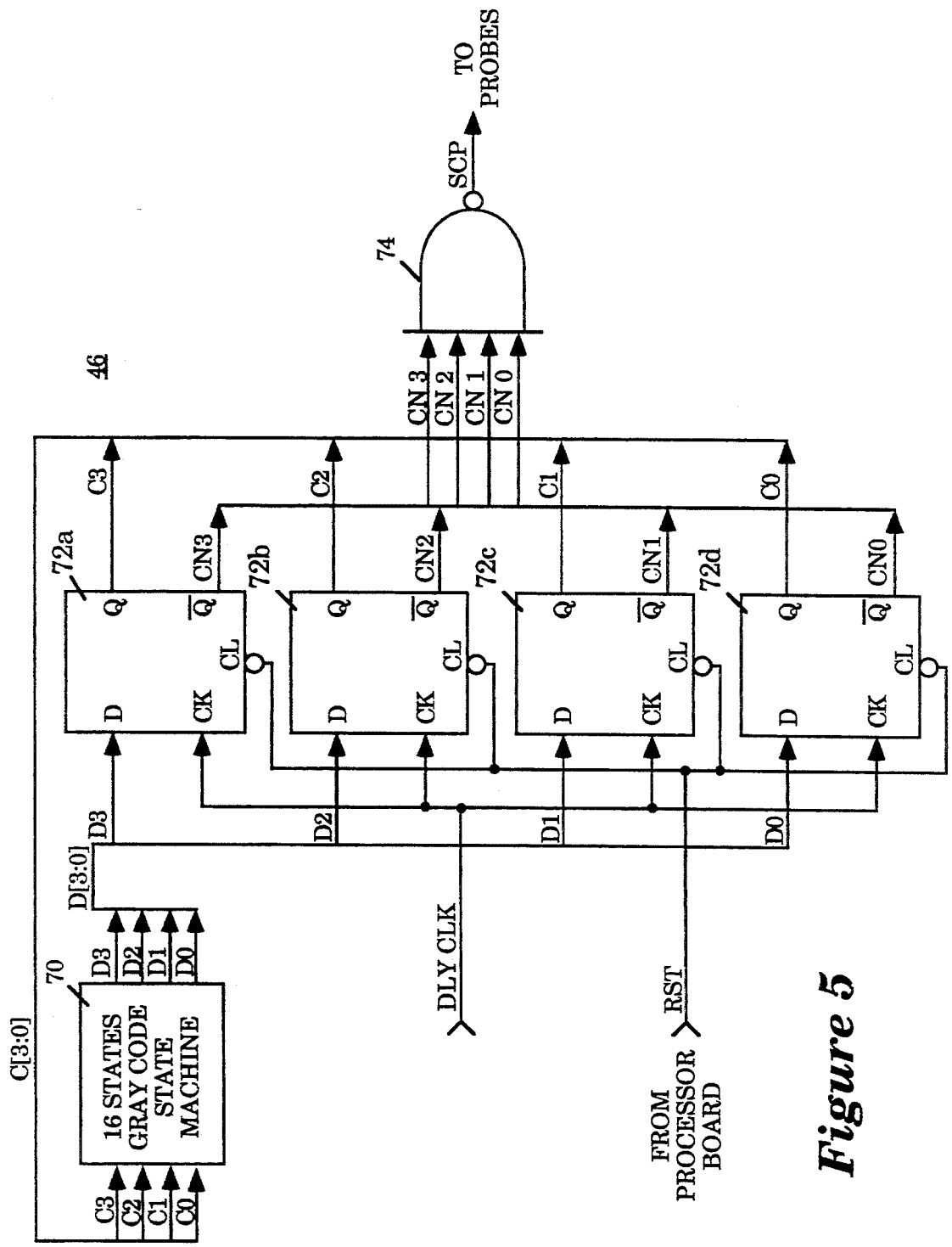
FIG. 5 illustrates one embodiment of the coordination pulse generator of FIG. 4 in further detail.

Referring now to FIGS. 4–5, two block diagrams illustrating one embodiment of the sync pulse generation coordinator of the present invention provided on the trace board of FIG. 2 are shown. As illustrated in FIG. 4, the sync pulse generation coordinator 28 comprises a clock selection circuit 42a, a delay line 44, a delayed clock selection circuit 42b, and a coordination pulse generation circuit 46, serially coupled to each other. The clock and delayed clock selection circuits 42a and 42b are similarly constituted. The clock selection circuit 42a is used to select one of the input clocks received from the probes through the TARs for output as a reference clock for the delay line 44. The delay line 44 is used to generate a number of delayed reference clocks for the delayed clock selection circuit 42b, with varying amount of delays applied to them, using the selected TAR clock received from the clock selection circuit 42a. The delayed clock selection circuit 42b is used to select one of the input delayed clocks received from the delay line 44 for output as a delayed reference clock for the coordination pulse generation circuit 46. The coordination pulse generation circuit 46 is used to generate coordination pulses for the probes, using the selected delay reference clock received from the delayed clock selection circuit 42b. Each probe is provided with its own copy of the generated coordination pulses.

In one embodiment, the clock/delayed clock selection circuit 42* comprises a multiplexor embodied in a programmable logic device (PLD). The PLD receives as inputs, either a clock from each of the TARs or a number of delayed clocks from the delay line, and additionally, either clock selection (CLK_SEL) or delayed clock selection (DELAY_SEL) controls from the processor board. In response, the PLD selects either one of the input TAR clocks as the reference clock for output to the delay line or one of the delayed clocks as the delayed reference clocks for output to the coordination pulse generation circuit 46. The selection of one of the input clocks received from the TARs as a reference clock is made in an arbitrary manner, thereby allowing some of the input clocks to be selectively disabled (not used) in some applications. The selection of one of the input delayed clocks as a delayed reference clock will be discussed in further detail below.

In one embodiment, the delay line 44 comprises a plurality of delay elements having six (6) delay points where delayed outputs may be obtained. The delay line 44 receives the selected TAR clock as inputs. In response, the delay line 44 outputs 6 delayed clocks for the delayed clock selection circuit, with six different amount of delays, 0, 4, 6, 8, 10, 12 ns applied to them at 6 different delay points of the delay line 44. Any one of a number of well known elements, including analog devices, may be used as delay elements. The number of delay elements, the number of delayed output points and their locations on the delay line are application dependent.

FIG. 5 illustrates one embodiment of the coordination pulse generation circuit. Similar to the sync pulse generation circuit provided to each probe, in this embodiment, the coordination pulse generation circuit 46 comprises a 16 states gray code state machine 70, four flip-flops 72a–72d with single inputs, and a NAND gate 74, serially coupled to each other. Except for the fact that the coordination pulse generation circuit 46 uses single input flip-flops 72a–72d, and the selected delayed reference clock (DLYCLK) for clocking the gray code state values in and out of the flip-flops 72a–72d, the coordination pulse generation circuit 46 otherwise operates and generates the coordination pulses in substantially the same manner as the sync pulse generation circuit provided to each probe.

Figure 8:
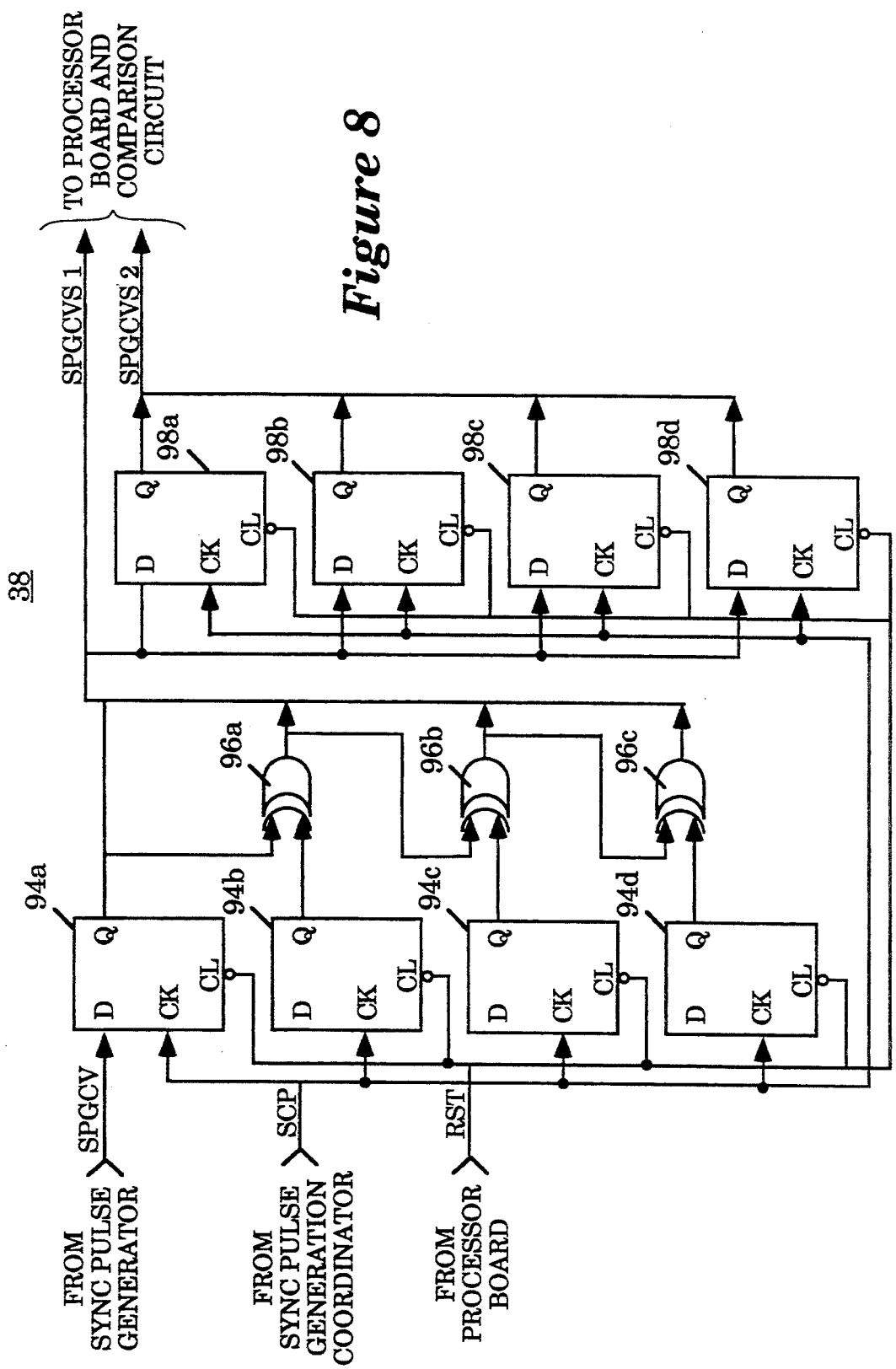
FIG. 8 illustrates one embodiment of the sampling circuit of FIG. 3 in further detail.
Figure 9:
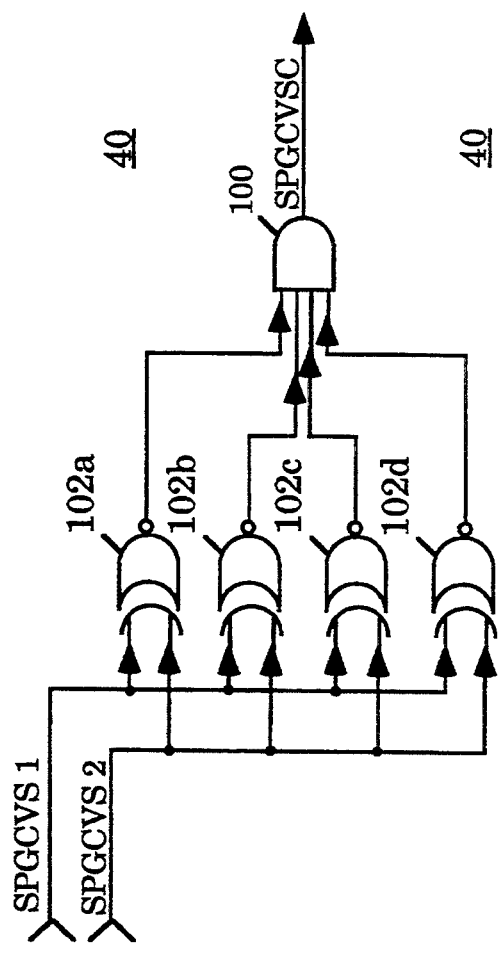
FIG. 9 illustrates one embodiment of the comparison circuit of FIG. 3 in further detail.

Referring now to FIGS. 8-9, two block diagrams illustrating one embodiment of the sampling and comparison circuits of the present invention provided to each of the probes are shown. As illustrated in FIG. 8, in this embodiment, the sampling circuit 38 provided to each probe comprises two sets of flip flops, 94a–94d and 98a–98d, and a set of Exclusive-OR (XOR) gates 96a–96c. The first set of flip flops 94a–94d is coupled to the XOR gates 96a–96c, which in turn are coupled to the second set of flip flops 98a–98d. Each set of flip flops, 94a–94d and 98a–98d, of the sampling circuit 38 provided to each probe takes, stores, and outputs one sample of the sync pulse generation control value (SPGCV) received from the sync pulse generation circuit (SPGCVS1 and SPGCVS2) of the probe, under the control of the coordination pulses (SCP) received from the sync pulse generation coordinator of the trace board. The set of XOR gates 98a–98c of the sampling circuit 38 of each probe is used to convert the first sample of control value taken for the probe from gray code into binary, thereby facilitating subsequent interpretation of the sampling results.

As illustrated in FIG. 9, in this embodiment, the comparison circuit 40 provided to each probe comprises a number of Exclusive-NOR (XNOR) gates 102a–102d, and a AND gate 100, serially coupled to each other. Together, the XNOR gates 102a–102d and the AND gate 104 determines whether the two samples (SPGCVS1 and SPGCVS2) taken are consistent. The two samples (SPGCVS1 and SPGCVS2) may be inconsistent because the coordination pulses provided by the sync pulse generation coordinator of the trace board may not be in sync with the local clocks used by the sync pulse generation circuits of the probes, and may cause a sample to be taken while the sync pulse generation control value is being changed. If the two samples are consistent, each of the XNOR gates 102a–102d outputs a logic one, thereby causing the AND gate 100 to output a logic one for the sample consistency control signal (SPGCVSC).

Figure 6:
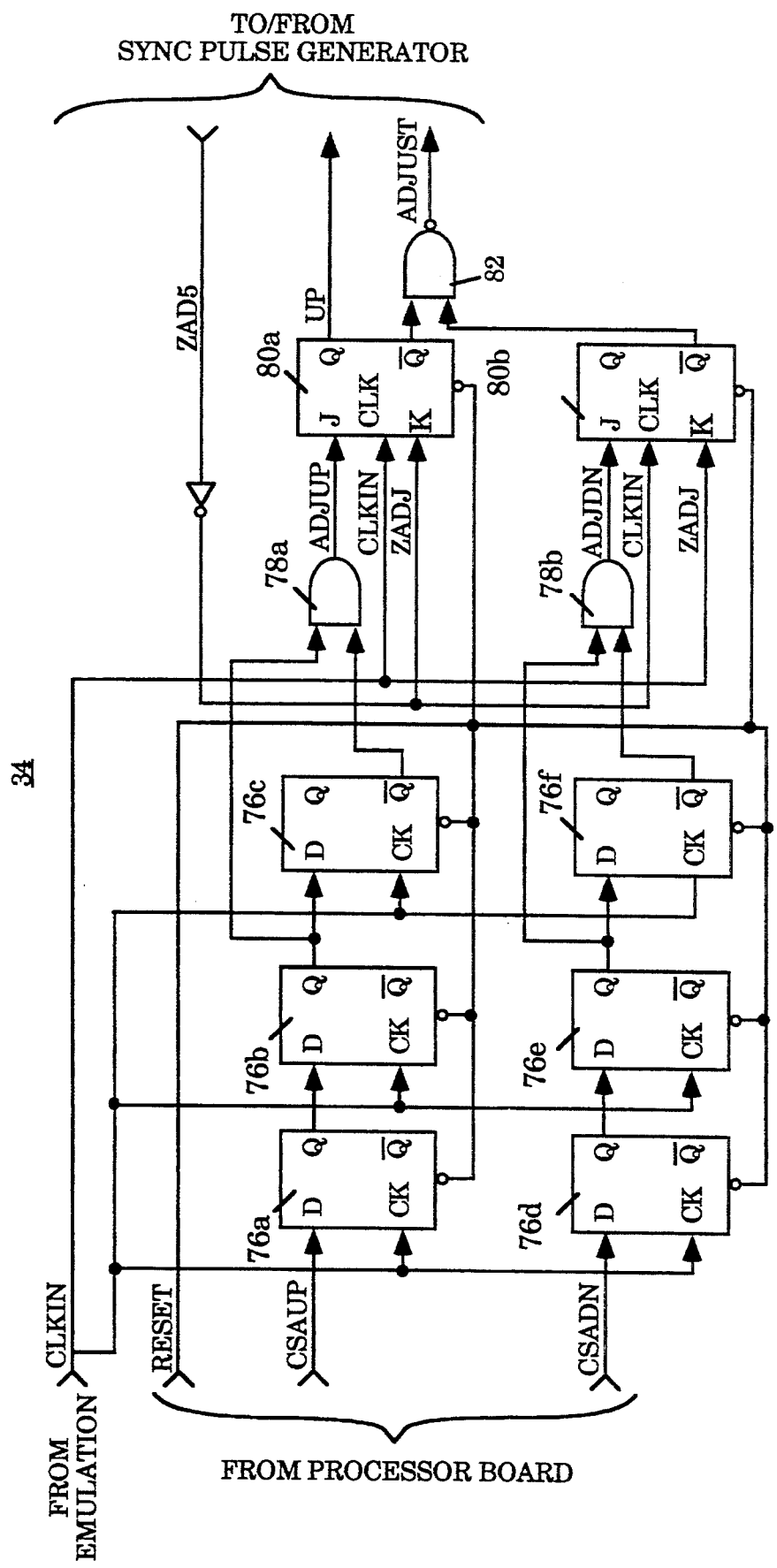
FIG. 6 illustrates one embodiment of the adjustment circuit of FIG. 3 in further detail.

Referring now to FIG. 6, a block diagram illustrating one embodiment of the adjustment circuit of the present invention provided to each probe in further detail is shown. The adjustment circuit 34 comprises two sets of single input flip flops 76a–76f, two corresponding AND gates 78a–78b, two dual input flip flops 80a–80b, and a NAND gate 82, serially coupled to each other. The two sets of single input flip flops 76a–76f and the two AND gates 78a–78b are used to generate two adjustment control signals (ADJUP and ADJDN) for the two J-K flip flops 80a–80b, using two adjustment controls (CSAUP and CSADN) received from the processor board through the trace board. Each of the two J-K flip flops 80a–80b also receives an adjustment feedback signal (ZADJ) from the sync pulse generation circuit of the same probe. The two J-K flip flops 82a–80b, in conjunction with the NAND gate 82 generate two adjustment control signals (UP and ADJUST) for the sync pulse generation circuit of the same probe, using a buffered clock (CLKIN) received from the emulation processor. The ZADJ signal is used to remove the signals UP and ADJUST after an adjustment has been done.

Referring now to FIG. 7 again, the UP adjustment control signal is provided to the D inputs of the last two flip-flops 86c–86d. The D inputs of the first two flip-flops 86a–86b are grounded. The ADJUST adjustment control signal is provided to the second NAND gate 88b. The second NAND gate 88b generates the ZADJ_N adjustment feedback signal using the ADJUST adjustment control signal and the complement of the gray code state value (CN0–CN3). The ZADJ_N adjustment feedback signal is also provided to the TE inputs of the flip-flops 86a–86d for controlling whether the D inputs or the TI inputs get clocked into and out of the flip-flops 86a–86d. Thus, when the control value in the flip-flops 86a–86d is a non-zero gray code state, regardless of the value of ADJUST, ZADJ_N equals 1, selecting the TI inputs of the flip-flops 86a–86d. Similarly, when the control value in the flip-flops 86a–86d is the zero gray code state, and ADJUST equals 0, ZADJ_N still equals 1, selecting the TI inputs of the flip-flops 86a–86d. On the other hand, when the control value in the flip-flops 86a–86d is the zero gray code state, and ADJUST equals 1, ZADJ_N equals 0, selecting the D inputs of the flip-flops 86a–86d. Therefore, if UP equals 1 whenever the D inputs of the flip-flops 86a–86d are selected, the control value in the flip-flops 86a–86d is advanced by 2 gray code states instead of 1 gray code state at the next clock pulse. On the other hand, if UP equals 0 whenever the D inputs of the flip-flops 86a–86d are selected, the control value in the flip-flops 86a–86d is held at the same gray code state for a successive clock pulse. After this clock pulse, the adjustment signal is removed as described earlier. As a result, adjustments to the control values in the flip-flops 86a–86d of the sync pulse generation circuits 36 of the various probes are effectuated.

Figure 10:
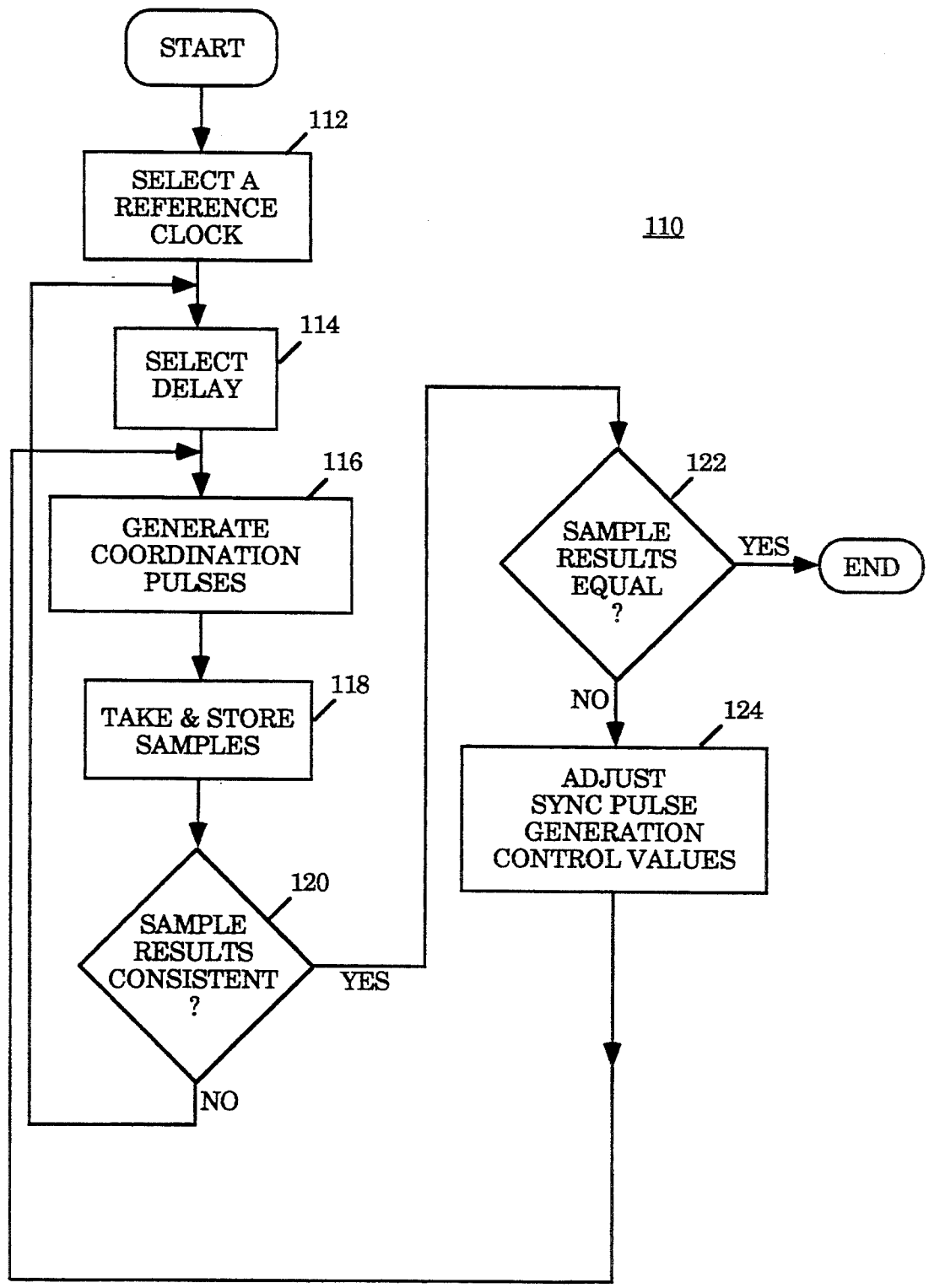
FIG. 10 illustrates the method of the present invention.

Referring now to FIG. 10, a block diagram summarizing the method of the present invention is shown. Initially, the sync pulse generation coordinator of the trace board selects one of the inputs clocks received from the TARs of the trace board as a reference clock, step 112. Next, the sync pulse generation coordinator selects one of the delayed clocks among the various delay points of its delay line as the delayed reference clock, step 114. The sync pulse generation coordinator then generates the coordination pulses for the probes using the selected delayed reference clock, step 116. In response, the sampling circuits of the various probes capture a number of samples of the control values of the sync pulse generation circuits of the various probes, step 118. The comparison circuits of the various probes then compare and determine whether the sample results of the various probes are consistent, step 120. The comparison and determination results are provided to the processor board through the trace board. If the sample results taken for at least one probe are inconsistent, the processor board adjusts the delay selection controls it provides to the sync pulse generation coordinator, causing the sync pulse generation coordinator to select a different delayed clock, step 114. Steps 116–120 are repeated, until the comparison circuits of all probes determine that all sample results taken for all probes are consistent, i.e. repetitive readings of the sample registers yield the same sample results.

Upon determining that all sample results are consistent, the processor board determines whether the sample results are all equal, i.e. the control values of the sync pulse generation circuits in the various probes are all equal, step 122. If the control value of at least one sync pulse generation circuit is not in sync with the control values of the other sync pulse generation circuits, the processor board changes the adjustment controls it provides to the adjustment circuits of the probes, whose sync pulse generation circuit control values are not in sync thereby effecting changes to the control values, step 124. Steps 116–124 are then repeated, until all consistent sample results are determined to be in sync.

Additionally, once the sync pulse generations by the sync pulse generation circuits of the various probes are synchronized, steps 116–122 can still be performed using the various elements of the present invention to monitor and ensure that the sample results remain consistent and in sync during the system's normal operation. If the control values of the various sync pulse generation circuits of the various probes start to go out of sync, an interrupt may be triggered. The interrupt may then be handled in a variety of application dependent manners, including but not limited to automatically halting operation, and repeating the process 110 to re-synchronize the control values.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. In a digital system comprising
a plurality of high speed data sending circuits and
a high speed data receiving circuit,
wherein each of said high speed data sending circuits concurrently generates and sends a stream of data slices and a companion stream of periodic sync pulses to said high speed data receiving circuit,
each of said high speed data sending circuits comprising sync pulse generation means for generating its stream of said periodic sync pulses using an internally generated stream of sync pulse generation control values,
said high speed data receiving circuit using said streams of periodic sync pulses to recombine said streams of data slices into a single stream of data,
an apparatus for synchronizing said generations of said streams of periodic sync pulses by said high speed data sending circuits, said apparatus comprising:

a) adjustment means coupled to said sync pulse generation means of said data sending high speed circuits for providing a plurality of streams of adjustments, one stream of adjustments to each of said streams of sync pulse generation control values;

b) sampling means coupled to said sync pulse generation means of said high speed data sending circuits for collecting a plurality of streams of sampling results, one stream of sampling results for each of said streams of sync pulse generation control values;

c) coordination pulse generation means coupled to said sampling means for generating a stream of periodic coordination pulses for said sampling means to control and coordinate said collections of said streams of sampling results; and d) processor means coupled to said sampling means, said coordination pulse generation means, and said adjustment means, for controlling said generations of said stream of periodic coordination pulses based on whether the sampling results of each of said streams of sync pulse generation control values are consistent, and for controlling provisions of said streams of adjustments to said streams of sync pulse generation control values based on whether the sampling results of said streams of sync pulse generation control values are synchronized.

2. The apparatus as set forth in claim 1, wherein, said sampling means comprises a plurality of flip flop assemblies, one flip flop assembly for each high speed data sending circuit, coupled correspondingly to said sync pulse generation means of said high speed data sending circuits, for collecting said streams of sampling results.

3. The apparatus as set forth in claim 2, wherein each of said flip flop assemblies comprises a first and a second set of flip flops, serially coupled to each other, for repeatedly collecting a first and a second sample of the stream of sync pulse generation control values of the sync pulse generation circuit of a high speed data sending circuit.

4. The apparatus as set forth in claim 3, wherein,
each of said sync pulse generation control values is in gray code;
each of said flip flop assemblies further comprises a set of XOR gates coupled to the first set of flips flops for converting each of the first samples captured in the first set of flip flops into binary before outputting each of the first samples;
the second set of flip flops is coupled to the first set of flip flops through the additional set of XOR gates and captures each of the second samples from the outputs of the additional set of XOR gates.

5. The apparatus as set forth in claim 1, wherein, said coordination pulse generation means comprises:

c.1) a delay line for receiving an input clock and generating a plurality of delayed clocks;

c.2) a delayed clock selector coupled to said delay line and said processor means for receiving said delayed clocks from said delay line and delayed clock selection controls from said processor means, and selecting one of said received delayed clocks as a delayed reference clock based on said received delayed clock selection controls; and c.3) a coordination pulse generator coupled to said delayed clock selector and said processor means for receiving said delayed reference clock from said delayed clock selector, receiving a stream of generation controls from said processor means, and in response, generating said stream of periodic coordination pulses using an internally generated stream of coordination pulse generation control values, said received delayed reference clock and said received stream of generation controls.

6. The apparatus as set forth in claim 5, wherein, said coordination pulse generator comprises:

c.3.1) a multi-state state machine for receiving a stream of input values, one at a time, and generating a stream of predetermined control state values, one at a time, in a predetermined manner based on said received stream of input values;

c.3.2) a plurality of flip flops coupled to said multi-state state machine and said processor means for capturing said generated stream of control state values, one at a time, as said stream of coordination pulse generation control values, and outputting each of said stream of coordination pulse generation control values to said multi-state state machine as one of said stream of input values;

c.3.3) a NAND gate coupled to said flip flops for generating said stream of periodic coordination pulses based said stream of coordination pulse generation control values.

7. The apparatus as set forth in claim 6, wherein, each of said generated stream of control state values is in gray code.

8. The apparatus as set forth in claim 5, wherein, said coordination pulse generator further comprises an input clock selector coupled to said delay line for receiving a plurality of potential input clocks, selecting and outputting said input clock for said delay line from said received potential input clocks.

9. The apparatus as set forth in claim 1, wherein, said adjustment means comprises a plurality of flip flop and gate assemblies, one flip flop and gate assembly for each of said high speed data sending circuits, coupled to said processor means and correspondingly to said sync pulse generation means of said high speed data sending circuits, for receiving a stream of adjustment controls from said processor means and streams of adjustment feedback from said sync pulse generation means of said high speed data sending circuits, and generating said streams of adjustments to said streams of sync pulse generation control values.

10. The apparatus as set forth in claim 9, wherein, each of said flip flop and gate assemblies comprises:

a multi-flip flop and multi-AND gate sub-assembly coupled to said processor means for repeatedly receiving a first and a second adjustment controls from said processor means, and generating a third and a fourth adjustment controls; and a dual flip flop and single NAND gate sub-assembly coupled to said multi-flip flop and multi-AND gate sub-assembly and the sync pulse generation means of the high speed data sending circuit for repeatedly receiving said third and fourth adjustment controls and an adjustment feedback, and generating an adjustment and a companion adjustment enable signal pair for the sync pulse generation means of a high speed data sending circuit.

11. The apparatus as set forth in claim 1, wherein said adjustments to said sync pulse generation control values comprise advancements for selected ones of the current sync pulse generation control values of the sync pulse generation means of said high speed data sending circuits to new sync pulse generation control values of a predetermined downstream distance from the current sync pulse generation control values for one clock period, and holding indicators for other selected ones of the current sync pulse generation control values of the sync pulse generation means of said high speed data sending circuits to hold the current sync pulse generation control values unchanged for a predetermined number of consecutive clock periods.

12. The apparatus as set forth in claim 1, wherein, said apparatus further comprises e) comparison means coupled to said sampling means and said processor means for comparing and determining whether said sampling results of each of said streams of sync pulse generation control values are consistent;

said stream of coordination pulses generated by said coordination pulse generation means is further used to control said comparisons and consistency determinations;

said processor means bases said control of said provisions of said streams of adjustments on said comparison and determination results.

13. The apparatus as set forth in claim 12, wherein, said comparison means comprises a plurality of gate assemblies, one for each high speed data sending circuit, coupled to said sampling means and said coordination pulse generation means for receiving said streams of sampling results, and determining whether said sampling results of each of said streams of sync pulse generation control values are consistent.

14. The apparatus as set forth in claim 13, wherein, each of said gate assemblies comprises:

a plurality of XNOR gates coupled to said sampling means for receiving the stream of sampling results of the stream of sync pulse generation control values of the sync pulse generation means of a high speed data sending circuit, two sampling results at a time, and in response, generating a plurality of comparison bits;

an AND gate coupled to said XNOR gates for receiving said comparison bits and generating a consistency indication bit.

15. In a digital system comprising a plurality of high speed data sending circuits, and a high speed data receiving circuit, wherein each of said high speed data sending circuits concurrently generates and sends a stream of data slices and a companion stream of periodic sync pulses to said high speed data receiving circuit, each of said high speed data sending circuits comprising sync pulse generation means for generating its stream of said periodic sync pulses using an internally generated streams of sync pulse generation control values, said high speed data receiving circuit using said streams of periodic sync pulses to recombine said streams of data slices into a single stream of data, a method for synchronizing said generations of said streams of periodic sync pulses by said high speed data sending circuits, said method comprising the steps of:

a) generating a stream of periodic coordination pulses using an initial delay value;

b) collecting corresponding streams of sampling results of said streams of sync pulse generation control values of said sync pulse generation means of said high speed data sending circuits based on said stream of periodic coordination pulses;

c) comparing and determining whether sampling results of each of said streams of sync pulse generation control values are consistent;

d) repeating said steps a) through c) using a new delay value each time for step (a), until sampling results of each of said streams of sync pulse generation control values are determined to be consistent;

e) providing corresponding streams of adjustments to said streams of sync pulse generation control values based on said streams of consistent sampling results; and f) repeating said steps a) through e) until sampling results of said streams of sync pulse generation control values are synchronized.

16. The method as set forth in claim 15, wherein, said step a) comprises the steps of:

a.1) receiving an input clock and generating a plurality of delayed clocks;

a.2) receiving said delayed clocks and a number of delayed clock selection controls, and selecting one of said received delayed clocks as a delayed reference clock based on said received delayed clock selection controls; and a.3) receiving said delayed reference clock and a stream of generation controls, a.4) generating a stream of coordination pulse generation control values in a predetermined manner, and a.5) generating said stream of periodic coordination pulses using said stream of coordination pulse generation control values, said received delayed reference clock and said received stream of generation controls.

17. The method as set forth in claim 16, wherein, said steps a.4) comprises the steps of:

a.4.1) receiving a stream of input values, one at a time, and generating a stream of predetermined control state values, one at a time, in a predetermined manner based on said received stream of input values, each of said stream of control state values comprising a plurality of bits;

a.4.2) capturing said generated stream of control state values, one at a time, as said stream of coordination pulse generation control values, and outputting each of said stream of coordination pulse generation control values as one of said stream of input values;

a.4.3) generating said stream of periodic coordination pulses by performing a NAND operation against the bits of each of said stream of coordination pulse generation control values.

18. The method as set forth in claim 17, wherein, each of said generated stream of control state values is in gray code.

19. The method as set forth in claim 16, wherein, said step a) further comprises the step of receiving a plurality of potential input clocks, selecting and outputting said input clock from said received potential input clocks.

20. The method as set forth in claim 15, wherein said step b) comprises repeatedly taking at least a first and a second sample of each stream of sync pulse generation control values.

21. The method as set forth in claim 20, wherein, each of said sync pulse generation control values is in gray code;

said step b) further comprises converting each of the first samples captured into binary before outputting each of the first samples; and each of the second samples is taken from each of the corresponding first samples being output.

22. The method as set forth in claim 15, wherein said step c) comprises repeatedly comparing at least a first and a second sample of each stream of sync pulse generation control values and determining whether the at least first and second samples are consistent.

23. The method as set forth in claim 15, wherein said step e) comprises advancing selected ones of the current sync pulse generation control values of the sync pulse generation means of said high speed data sending circuits to new sync pulse generation control values of a predetermined downstream distance from the current sync pulse generation control values for one clock period, and holding other selected ones of the current sync pulse generation control values of the sync pulse generation means of said high speed circuits unchanged for a predetermined number of consecutive clock periods.

24. In a digital system comprising a plurality of high speed data sending circuits and a high speed data receiving circuit, wherein each of said high speed data sending circuits concurrently generates and sends a stream of data slices and a companion stream of periodic sync pulses to said high speed data receiving circuit, each of said high speed data sending circuits comprising a sync pulse generation circuit for generating its stream of said periodic sync pulses using an internally generated stream of sync pulse generation control values, said high speed data receiving circuit using said streams of periodic sync pulses to recombine said streams of data slices into a single stream of data, an apparatus for synchronizing said generations of said streams of periodic sync pulses by said high speed data sending circuits, said apparatus comprising:

a) at least one adjustment circuit coupled to said sync pulse generation circuits of said high speed data sending circuits for providing a plurality of streams of adjustments one stream of adjustments to each of said streams of sync pulse generation control values:

b) at least one sampling circuit coupled to said sync pulse generation circuits of said high data sending speed circuits for collecting a plurality of streams of sampling results for each of said streams of sync pulse generation control values;

c) a coordination pulse generation circuit coupled to said at least one sampling circuit for generating a of periodic coordination pulses for said at least one sampling circuit to control and coordinate said collection of said streams of sampling results; and d) a processor coupled to said at least one sampling circuit, said coordination pulse generation circuit, and said at least one adjustment circuit for controlling said generations of said stream of periodic coordination pulses based on whether the sampling results of each of said streams of sync pulse generation control values are consistent, and for controlling provisions of said streams of adjustments to said sync pulse generation control values based on whether the sampling results of said streams of sync pulse generation control values are synchronized.

25. The apparatus as set forth in claim 24, wherein, said at least one sampling circuit comprises a plurality of flip flop assemblies, one flip flop for each high speed data sending circuit, coupled correspondingly to said sync pulse generation circuits of said high speed data sending circuits, for collecting said streams of sampling results, each of said flip flop assemblies being disposed on its corresponding high speed data sending circuit.

26. The apparatus as set forth in claim 24, wherein, said coordination pulse generation circuit comprises:
   c.1) a delay line for receiving an input clock and generating a plurality of delayed clocks;
   c.2) a delayed clock selector coupled to said delay line and said processor for receiving said delayed clocks from said delay line and delayed clock selection controls from said processor, and selecting one of said received delayed clocks as a delayed reference clock based on said received delayed clock selection controls; and
   c.3) a coordination pulse generation circuit coupled to said delayed clock selector and said processor for receiving said delayed reference clock from said delayed clock selector, receiving a stream of generation controls from said processor, and in response, generating said stream of periodic coordination pulses using an internally generated stream of coordination pulse generation control values, said received delayed reference clock and said received stream of generation controls.

27. The apparatus as set forth in claim 26, wherein, said coordination pulse generation circuit further comprises an input clock selector coupled to said delay line for receiving a plurality of potential input clocks, selecting and outputting said input clock for said delay means from said received potential input clocks.

28. The apparatus as set forth in claim 24, wherein, said at least one adjustment circuit comprises a plurality of flip flop and gate assemblies, one flip flop gate assembly for each of said high speed data sending circuits, coupled to said processor and correspondingly to said sync pulse generation circuits of said high speed data sending circuits, for receiving a stream of adjustment controls from said processor and streams of adjustment feedback from said sync pulse generation circuits of said high speed data sending circuits, and generating said streams of adjustments to said streams of sync pulse generation control values.

29. The apparatus as set forth in claim 24, wherein said adjustments to said sync pulse generation control values comprise
   advancements for selected ones of the current sync pulse generation control values of the sync pulse generation circuits of said high speed circuits to new sync pulse generation control values of a predetermined downstream distance from the current sync pulse generation control values for one clock period, and
   holding indicators for other selected ones of said sync pulse generation control values of the sync pulse generation circuits of said high speed data sending circuits to hold the current sync pulse generation control values unchanged for a predetermined number of consecutive clock periods.

30. The apparatus as set forth in claim 24, wherein,
   said apparatus further comprises e) at least one comparison circuit coupled to said at least one sampling circuit and said processor for comparing and determining whether said sampling results of each of said stream of sync pulse generation control values are consistent;
   said stream of coordination pulses generated by said coordination pulse generation circuit is further used to control said comparisons and consistency determinations;
   said processor bases said control of said provisions of said streams of adjustments.

31. The apparatus as set forth in claim 30, wherein, said at least one comparison circuit comprises a plurality of gate assemblies, one for each high speed data sending circuit, coupled to said at least one sampling circuit and said coordination pulse generation circuit for receiving said streams of sampling results, and determining whether sampling results of each of said stream of sync pulse generation control values are consistent, said plurality of gate assemblies being disposed correspondingly on said high speed data sending circuits.

32. The apparatus as set forth in claim 24, wherein,
   said digital system is a data instrumentation system;
   said high speed data sending circuits are probes of said data instrumentation system; and
   said high speed data receiving circuit is a trace control circuit of a trace board of said data instrumentation system to which said probes are coupled.

33. A data instrumentation system comprising:
   a) a plurality of high speed data sending probes for concurrently generating and sending a plurality of streams of data slices and a plurality of companion streams of periodic sync pulses, each of said high speed data sending probes comprising,
      a.1) a sync pulse generation circuit for generating its stream of said periodic sync pulses using an internally generated stream of sync pulse generation control values,
      a.2) a sampling circuit coupled to the sync pulse generation circuit for collecting a stream of sampling results the stream of sync pulse generation control values,
      a.3) an adjustment circuit coupled to the sync pulse generation circuit for providing a stream of adjustments to the stream of sync pulse generation control values,
   b) a high speed data receiving trace control circuit coupled to said data sending high speed probes for receiving said streams of data slices and said streams of periodic sync pulses, and recombining said received streams of data slices into a single stream of data using said received streams of periodic sync pulses;
   c) a coordination pulse generation circuit coupled to said sampling circuits of said high speed data sending probes for generating a stream of periodic coordination pulses for said sampling circuits to control and coordinate said collections of streams of sampling results; and d) a processor coupled to said sampling and adjustment circuits of said high speed data sending circuits, and said coordination pulse generation circuit, for controlling said generations of said stream of periodic coordination pulses based on whether sampling results of each of said streams of sync pulse generation control values are consistent, and for controlling provisions of said streams of adjustments to said streams of sync pulse generation control values based on whether said sampling results of said streams of sync pulse generation control values are synchronized.

34. The data instrumentation system as set forth in claim 33, wherein, each of said high speed data sending probes further comprises a.4) a comparison circuit coupled to the sampling circuit and said processor for comparing and determining whether sampling results of the stream of sync pulse generation control values of the sync pulse generation circuit of a high speed data sending probe are consistent;

said stream of coordination pulses generated by said coordination pulse generation circuit are further used to control said comparisons and consistency determinations;

said processor bases said control of said provisions of said streams of adjustments on said comparison and determination results.

35. The apparatus as set forth in claim 1, wherein, once said generations of said streams of periodic sync pulses are synchronized, said sampling means, said coordination pulse generation means, and said processor means cooperate to monitor whether said generations of said streams of periodic sync pulses remain in sync.

36. The method as set forth in claim 15, wherein, said method further comprises the step of g) repeating said steps a) through d) periodically to monitor whether said generations of said streams of periodic sync pulses remain in sync, once said generations of said streams of periodic sync pulses are synchronized.

37. The apparatus as set forth in claim 24, wherein, once said generations of said streams of periodic sync pulses are synchronized, said at least one sampling circuit, said coordination pulse generation circuit, and said processor cooperate to monitor whether said generations of said streams of periodic sync pulses remain in sync.

38. In a digital system comprising
a plurality of high speed data sending circuits and
a high speed data receiving circuit,
wherein each of said high speed data sending circuits concurrently generates and sends a stream of data slices and a companion stream of periodic sync pulses to said high speed data receiving circuit,
each of said high speed data sending circuits comprising a sync pulse generation circuit for generating its stream of periodic sync pulses using an internally generated stream of sync pulse generation control values, said high speed data receiving circuit using said streams of periodic sync pulses to recombine said streams of data slices into a single stream of data, an apparatus for synchronizing said generations of said streams of periodic sync pulses by said high speed data sending circuits, said apparatus comprising:

a) at least one adjustment circuit coupled to said sync pulse generation circuits of said high speed data sending circuits for providing a plurality of streams of adjustments, one stream of adjustments to each of said streams of sync pulse generation control values;

b) at least one sampling circuit coupled to said sync pulse generation circuits of said high data sending speed circuits for collecting a plurality of streams of sampling results for each of said streams of sync pulse generation control values;

c) controlling circuitry coupled to said at least one sampling circuit, and said at least one adjustment circuit for analyzing said sampling results, and controlling said collections of said sampling results as well as said provisions of said adjustments based on said analyses.

39. A data instrumentation system comprising:
a) a plurality of high speed data sending probes for concurrently generating and sending a plurality of streams of data slices and a plurality of companion streams of periodic sync pulses, each of said high speed data sending probes comprising, a.1) a sync pulse generation circuit for generating its stream of periodic sync pulses using an internally generated stream of sync pulse generation control values, a.2) a sampling circuit coupled to the sync pulse generation circuit for collecting a stream of sampling results of the stream of sync pulse generation control values, a.3) an adjustment circuit coupled to the sync pulse generation circuit for providing a stream of adjustments to the stream of sync pulse generation control values, b) a high speed data receiving trace control circuit coupled to said data sending high speed probes for receiving said streams of data slices and said streams of periodic sync pulses, and recombining said received streams of data slices into a single stream of data using said received streams of periodic sync pulses; and c) controlling circuitry coupled to said sampling and adjustment circuits of said high speed data sending circuits for analyzing said sampling results, and controlling said collection of said sampling results as well as said provisions of said adjustment based on said analyses.

* * * * *